United States Patent
Inzunza Figueroa et al.

(10) Patent No.: US 9,459,310 B2
(45) Date of Patent: Oct. 4, 2016

(54) INVERTER TEST APPARATUS

(71) Applicant: TOSHIBA MITSUBISHI-ELECTRIC INDUSTRIAL SYSTEMS CORPORATION, Minato-ku, Tokyo (JP)

(72) Inventors: Ruben Alexis Inzunza Figueroa, Tokyo (JP); Tatsuaki Amboh, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 93 days.

(21) Appl. No.: 13/799,979

(22) Filed: Mar. 13, 2013

(65) Prior Publication Data

US 2013/0241585 A1 Sep. 19, 2013

(30) Foreign Application Priority Data

Mar. 13, 2012 (JP) ................. 2012-056351

(51) Int. Cl.
*G01R 31/00* (2006.01)
*G01R 31/28* (2006.01)
*G01R 31/42* (2006.01)

(52) U.S. Cl.
CPC ............. *G01R 31/28* (2013.01); *G01R 31/42* (2013.01)

(58) Field of Classification Search
CPC .............. G01R 31/31924; G01R 31/31922; G01R 31/31937; G01R 31/021; G01R 31/026; G01R 31/024; G01R 31/028; G01R 35/00; G01R 1/06788; G01R 19/145; G11C 29/1201; G01D 5/24; G06K 9/0002; H03K 17/962; F02P 17/00; F02P 17/06; F02P 17/12; F02P 5/02; F02P 15/00

USPC .............. 324/750.01, 750.02, 383, 555, 652, 324/654–658, 683, 691

See application file for complete search history.

(56) References Cited

U.S. PATENT DOCUMENTS

| | | | |
|---|---|---|---|
| 5,493,485 A * | 2/1996 | Okado | H02H 7/1227 363/56.01 |
| 6,218,853 B1 * | 4/2001 | Liu | 324/764.01 |
| 6,366,483 B1 * | 4/2002 | Ma | H02M 1/4216 363/37 |
| 6,429,546 B1 * | 8/2002 | Ropp et al. | 307/31 |

(Continued)

FOREIGN PATENT DOCUMENTS

| | | |
|---|---|---|
| JP | 2000-69765 | 3/2000 |
| JP | 2003-153546 | 5/2003 |

(Continued)

OTHER PUBLICATIONS

First Office Action issued by the Japanese Patent Office on Oct. 6, 2015, for Japanese Patent Application No. 2012-056351, and English-language translation thereof.

*Primary Examiner* — Tung X Nguyen
*Assistant Examiner* — Thang Le
(74) *Attorney, Agent, or Firm* — Finnegan, Henderson, Farabow, Garrett & Dunner, LLP

(57) ABSTRACT

There is provided an inverter test apparatus for testing an inverter interconnected with an alternating-current power system, the apparatus including an alternating-current power output unit configured to output alternating-current power, and an alternating-current power controller configured to control the alternating-current power output from the alternating-current power output unit to simulate an alternating-current load of the inverter.

10 Claims, 4 Drawing Sheets

(56) References Cited

U.S. PATENT DOCUMENTS

| | | | | |
|---|---|---|---|---|
| 6,810,339 | B2 * | 10/2004 | Wills | H02J 3/383 700/297 |
| 6,853,940 | B2 * | 2/2005 | Tuladhar | 702/111 |
| 7,408,268 | B1 * | 8/2008 | Nocentini et al. | 307/16 |
| 8,510,090 | B2 * | 8/2013 | Hesse | H02J 3/38 703/13 |
| 8,681,515 | B2 * | 3/2014 | Bae | H02H 3/38 363/36 |
| 8,824,174 | B2 * | 9/2014 | Lai | H02J 3/38 363/40 |
| 8,836,162 | B2 * | 9/2014 | Leutwein | H02J 3/383 307/126 |
| 8,848,404 | B2 * | 9/2014 | Tan | H02M 7/515 363/140 |
| 8,860,236 | B2 * | 10/2014 | Nasiri | 290/44 |
| 8,970,154 | B2 * | 3/2015 | Ishikawa | 318/438 |
| 2007/0007929 | A1 * | 1/2007 | Lee | H02M 7/53875 318/802 |
| 2010/0161259 | A1 * | 6/2010 | Kim | G05B 23/0283 702/63 |
| 2011/0115301 | A1 * | 5/2011 | Bhavaraju et al. | 307/86 |
| 2011/0121774 | A1 * | 5/2011 | Shimada | 318/729 |
| 2011/0270463 | A1 * | 11/2011 | Weiss et al. | 700/298 |
| 2012/0087159 | A1 * | 4/2012 | Chapman | H02J 3/383 363/41 |
| 2013/0062957 | A1 * | 3/2013 | Bhavaraju | H02J 3/38 307/82 |

FOREIGN PATENT DOCUMENTS

| | | |
|---|---|---|
| JP | 2007-236101 | 9/2007 |
| JP | 2008-104262 | 5/2008 |
| JP | 2008167655 | * 7/2008 |

* cited by examiner

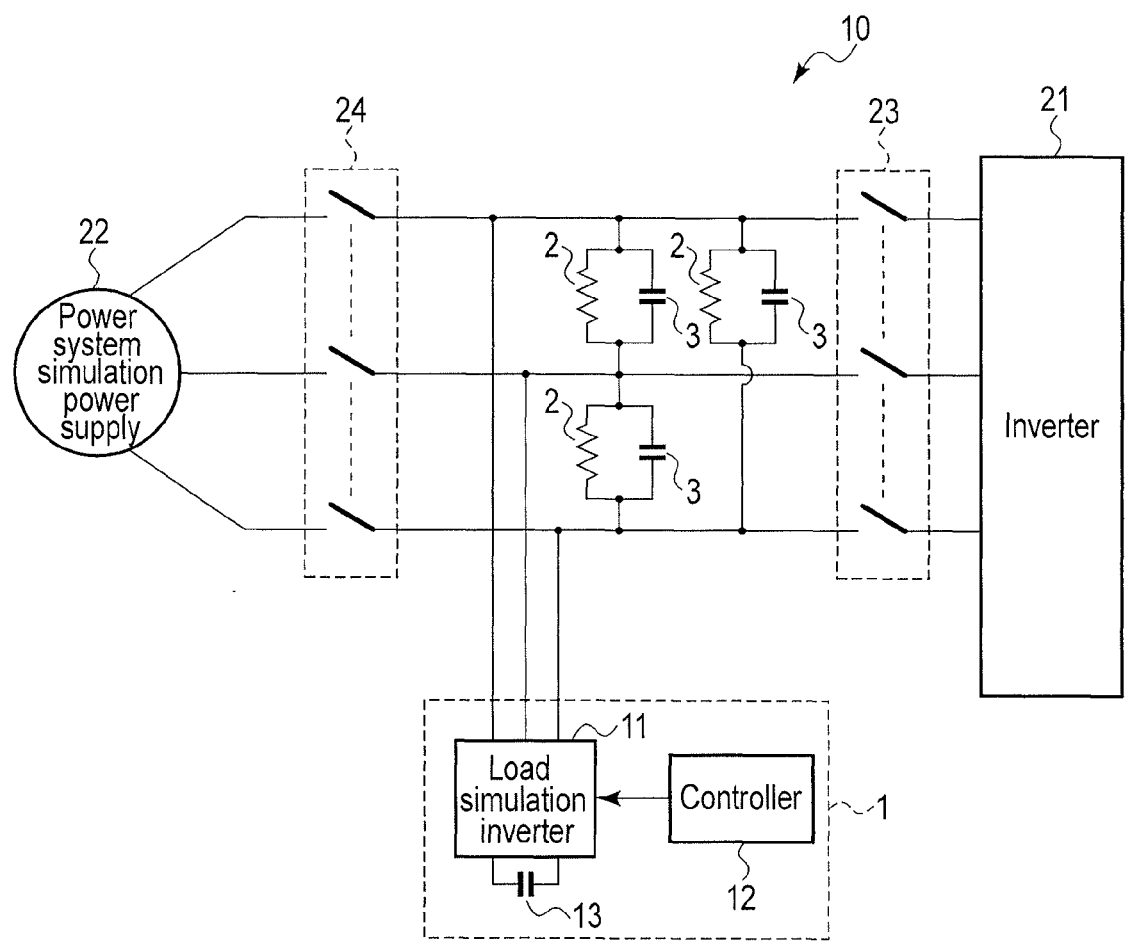
F I G. 1

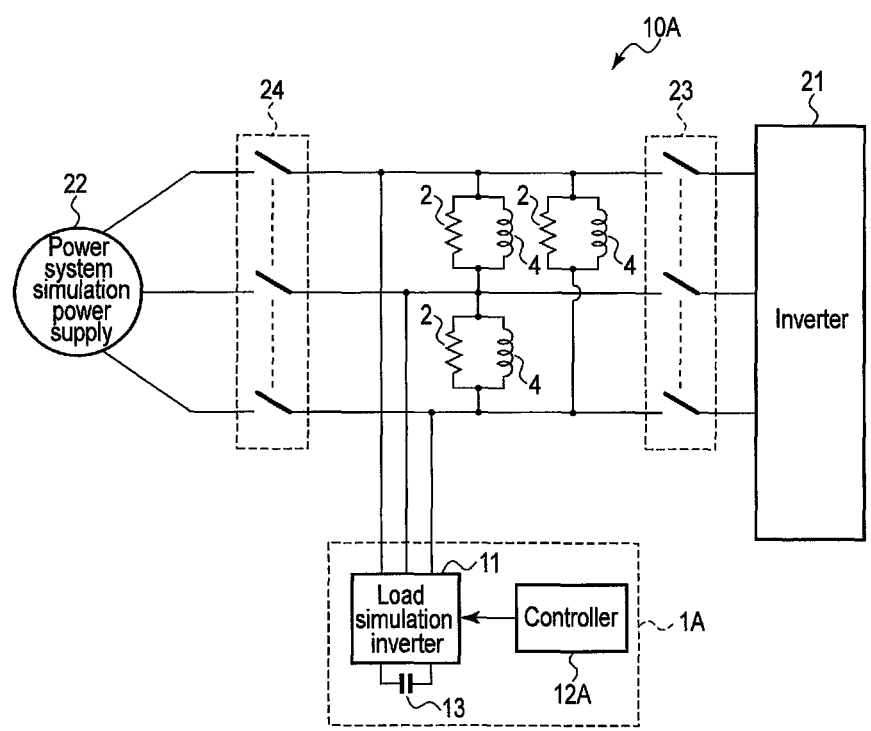
F I G. 2

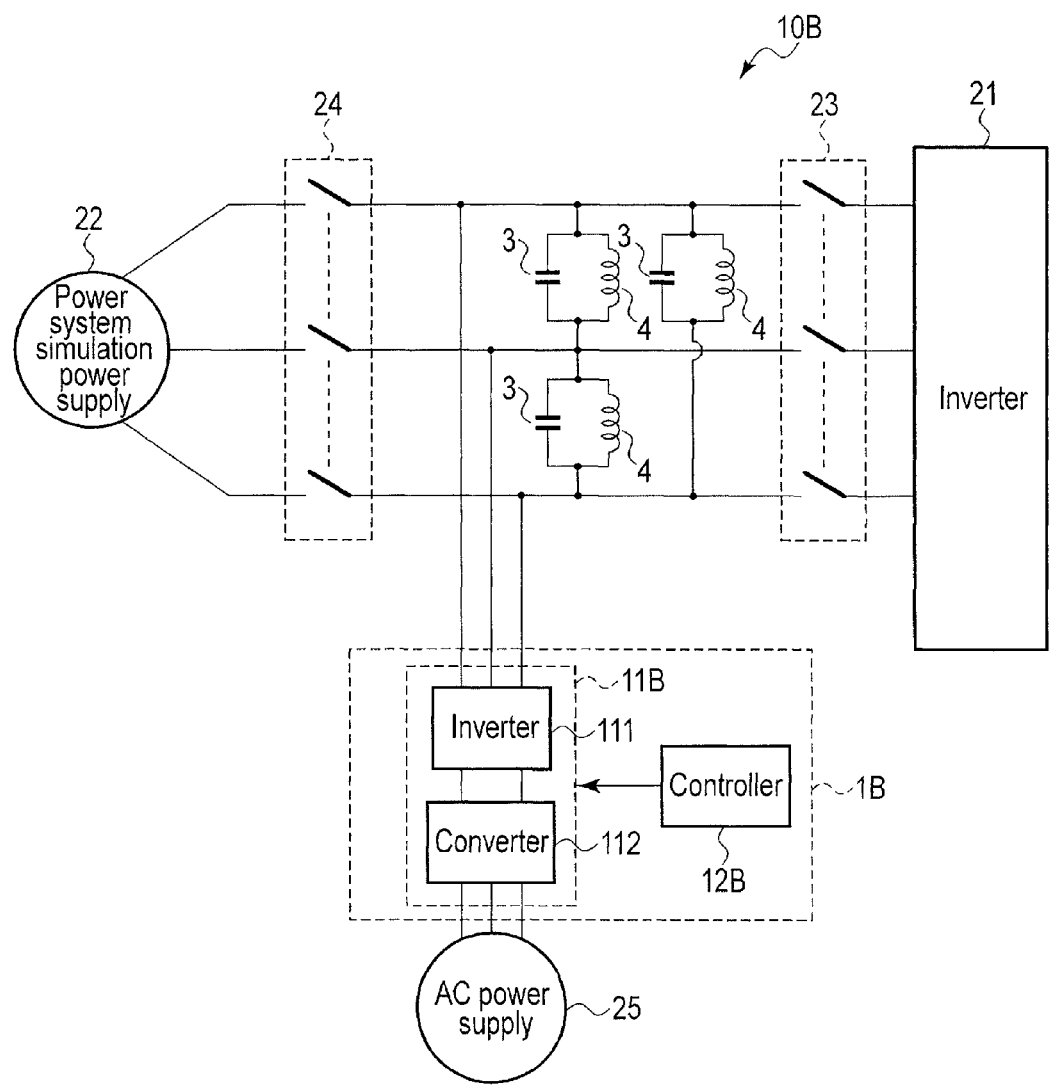
F I G. 3

INVERTER TEST APPARATUS

CROSS-REFERENCE TO RELATED APPLICATIONS

This application is based upon and claims the benefit of priority from prior Japanese Patent Application No. 2012-056351, filed Mar. 13, 2012, the entire contents of which are incorporated herein by reference.

BACKGROUND OF THE INVENTION

1. Field of the Invention

The invention relates to an apparatus for use in testing an inverter.

2. Description of the Related Art

In general, in a dispersed power supply system such as a photovoltaic power system, an inverter is used to establish interconnection with an alternating current (AC) power system. In such an inverter, a function for avoiding islanding may be demanded in some cases (see, for example, Jpn. Pat. Appln. KOKAI Publication No. 2008-104262).

For example, in the Institute of Electrical and Electronics Engineers (IEEE) 1547 standard, conducting the following islanding test is demanded.

First, to conduct the anti-islanding test, a circuit is configured to interconnect an AC power system with an inverter. An AC load is connected to this circuit so that AC power can be supplied from the AC power system and the inverter. This AC load is set such that inductance and capacitance thereof have the same value. Then, electric power is supplied to the AC load by parallel operations of the AC power system and the inverter, whereby the AC load is caused to resonate. In this resonating state, the AC power system is disconnected from the circuit, and islanding of the inverter is allowed. At this time, the inverter solely supplies electric power to the AC load. In this anti-islanding test, it is confirmed that the inverter is automatically stopped in such an islanding state.

However, a capacity of the AC load provided to conduct the above-described test must be increased as a capacity of the inverter as a test target is raised. Therefore, when the inverter is large, the AC load is also large.

BRIEF SUMMARY OF THE INVENTION

It is an object of the invention to provide an inverter test apparatus capable of simulating an AC load which is used for testing an inverter.

In accordance with an aspect of embodiments of the invention, there is provided an inverter test apparatus for use in testing an inverter interconnected with an alternating-current power system, the apparatus comprising an alternating-current power output unit configured to output alternating-current power; and an alternating-current power controller configured to control the alternating-current power output from the alternating-current power output unit to simulate an alternating-current load of the inverter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a test circuit to which an AC load simulator according to a first embodiment of the invention is applied;

FIG. 2 is a block diagram showing a test circuit to which an AC load simulator according to a second embodiment of the invention is applied;

FIG. 3 is a block diagram showing a test circuit to which an AC load simulator according to a third embodiment of the invention is applied.

DETAILED DESCRIPTION OF THE INVENTION

Figure 4:
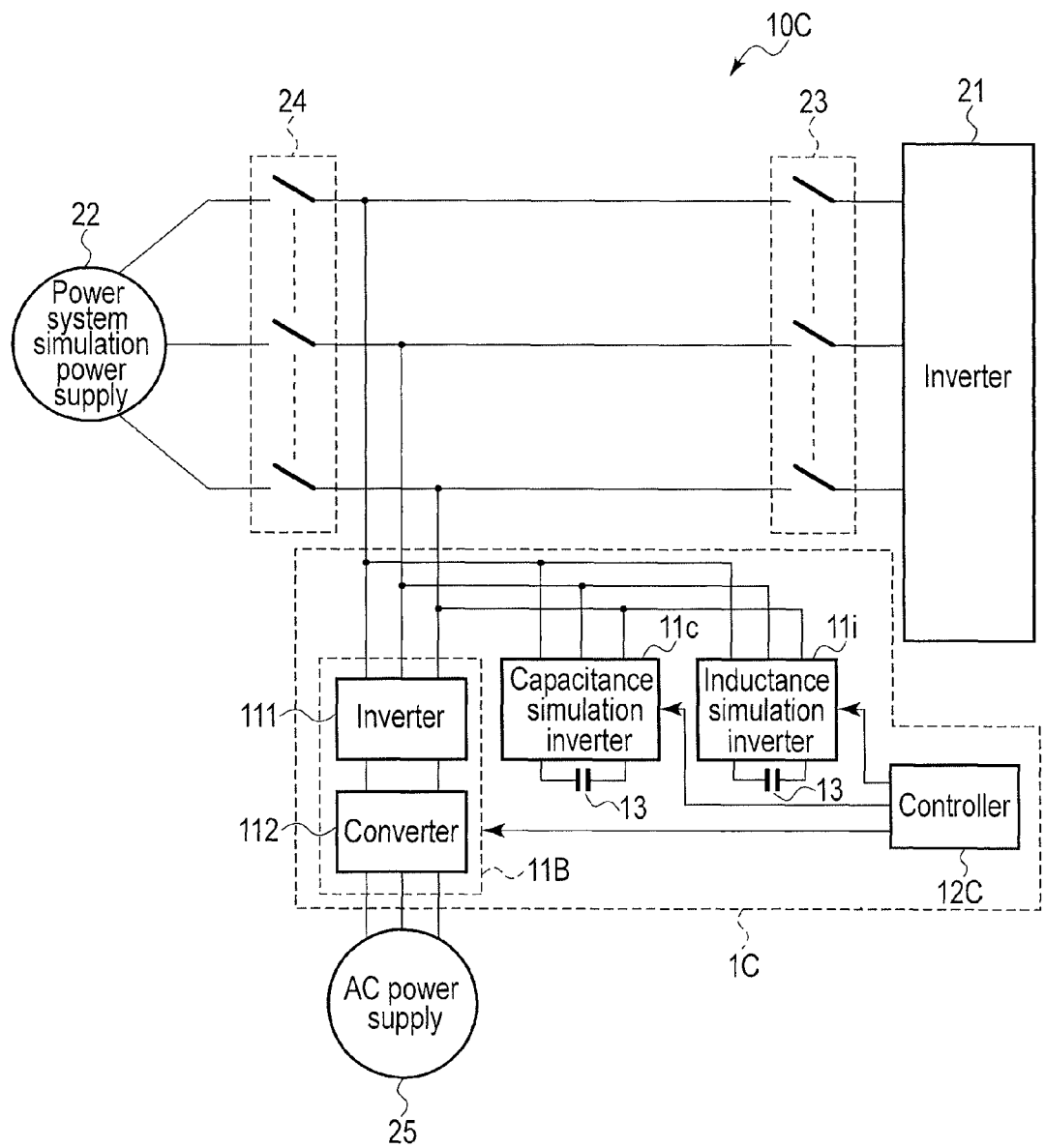
FIG. 4 is a block diagram showing a test circuit to which an AC load simulator according to a fourth embodiment of the invention is applied.

Embodiments according to the invention will now be described hereinafter with reference to the accompanying drawings.

(First Embodiment)

FIG. 1 is a block diagram showing a test circuit 10 to which an AC load simulator 1 according to a first embodiment of the invention is applied. It is to be noted that like reference numbers denote like parts in subsequent drawings to omit a detailed description thereof, and different parts will be mainly described. In regard to subsequent embodiments, an overlapping description will be likewise omitted.

The test circuit 10 is configured to include the AC load simulator 1, three AC load resistors 2, three AC load capacitors 3, an inverter 21, a power system simulation power supply 22, an inverter-side circuit breaker 23, and a system-side circuit breaker 24.

The inverter 21 is connected to the power system simulation power supply 22 via the inverter-side circuit breaker 23 and the system-side circuit breaker 24 in the mentioned order. The inverter 21 is an apparatus which is a test target. To achieve interconnection with the power system simulation power supply 22, the inverter 21 controls three-phase AC power to output. The inverter 21 is interconnected with the power system simulation power supply 22 and supplies AC power to AC loads 1, 2, and 3.

The power system simulation power supply 22 is a power supply configured to simulate a grid. The power system simulation power supply 22 generates the three-phase AC power. The power system simulation power supply 22 is interconnected with the inverter 21 and supplies the AC power to the AC loads 1, 2, and 3.

The inverter-side circuit breaker 23 is a switch configured to disconnect the inverter 21 from the test circuit 10.

The system-side circuit breaker 24 is a switch configured to disconnect the power system simulation power supply 22 from the test circuit 10.

The AC load simulator 1 is connected between the inverter-side circuit breaker 23 and the system-side circuit breaker 24. The AC load simulator 1 is a test apparatus that simulates inductance of a passive load in order to conduct an anti-islanding test of the inverter 21.

Each of the three AC load resistors 2 is provided between respective lines of a circuit provided between the inverter-side circuit breaker 23 and the system-side circuit breaker 24. The AC load resistor 2 is a passive element configured to simulate resistance of the passive load.

Each of the three AC load capacitors 3 is provided between the respective lines of the circuit provided between the inverter-side circuit breaker 23 and the system-side circuit breaker 24. Each AC load capacitor 3 is connected in parallel with each AC load resistor 2. The AC load capacitor 3 is a passive element configured to simulate capacitance of the passive load.

The AC load simulator 1 comprises a load simulation inverter 11, a controller 12, and a capacitor 13.

An AC side of the load simulation inverter 11 is connected to each phase between the inverter-side circuit breaker 23 and the system-side circuit breaker 24. The capacitor 13 is connected to a direct-current side of the load simulation inverter 11. It is to be noted that the capacitor 13 may be a capacitor that is built in the load simulation inverter 11. Therefore, the capacitor does not necessarily have to be connected to direct-current terminals of the load simulation inverter 11.

The controller 12 controls an AC output from the load simulation inverter 11 to simulate the inductance of the AC load. For example, if load power of the AC load resistors 2 is 500 kW and load power of the AC load capacitors 3 is 500 kvar, the controller 12 controls the load simulation inverter 11 to simulate load power of 500 kvar of the reactance having a sign opposite to that of the AC load capacitors 3. As a result, the AC capacitors 3 are caused to resonate.

In the anti-islanding test, resonance is effected by control of the controller 12, and then the system-side circuit breaker 24 is opened. As a result, the inverter 21 becomes in a state of solely supplying electric power to the AC load. As test conditions, for example, in a state that the interconnection is achieved, a power supply ratio of the inverter 21 with respect to the AC load is set to, for example, 98%. When the system-side circuit breaker 24 is opened, the power supply ratio of the inverter 21 with respect to the AC load becomes 100% (an islanding state). In the anti-islanding test, it is confirmed that the inverter 21 is automatically stopped in this islanding state.

According to this embodiment, when the AC load simulator 1 is controlled to simulate the inductance, the anti-islanding test can be conducted without providing reactors (inductors) as the AC load for the test.

As a result, even if the inverter 21 as the test target has a large capacity, a large-capacity reactor does, not have to be provided for the anti-islanding test. Therefore, when the capacity of the inverter 21 is increased, it is possible to suppress a cost and a circuit scale required for the circuit used for the conducting the anti-islanding test.

(Second Embodiment)

FIG. 2 is a block diagram showing a test circuit 10A to which an AC load simulator 1A according to a second embodiment of the invention is applied.

The test circuit 10A has the AC load simulator 1A that substitutes for the AC load simulator 1 and three AC reactors 4 that substitute for the three AC load capacitors 3 in the test circuit 10 according to the first embodiment shown in FIG. 1. Other structures are the same as those in the test circuit 10 according to the first embodiment.

Each of the three AC load reactors 4 is provided between respective lines of a circuit provided between the inverter-side circuit breaker 23 and the system-side circuit breaker 24. Each AC load reactor 4 is connected in parallel with each AC load reactor 2. Each AC reactor 4 is a passive element configured to simulate inductance of a passive load.

The AC load simulator 1A has a controller 12A that substitutes for the controller 12 in the AC load simulator 1 according to the first embodiment. Other structures are the same as those in the AC load simulator 1 according to the first embodiment.

The controller 12A controls an AC output from the load simulation inverter 11 to simulate capacitance of the AC load. For example, if load power of the AC load resistors 2 is 500 kW and load power of the AC load reactors 4 is 500 kvar, the controller 12A controls the load simulation inverter 11 to simulate load power of 500 kvar of reactance having a sign opposite to that of the AC load reactors 4. As a result, the AC load reactors 4 are caused to resonate.

A method of conducting an anti-islanding test is the same as that of the first embodiment.

According to this embodiment, when the AC load simulator 1A is controlled to simulate the capacitance, the anti-islanding test can be conducted without providing capacitors as the AC load for the test.

As a result, even if the inverter 21 as the test target has a large capacity, a large-capacity reactor does not have to be provided for the anti-islanding test. Therefore, when the capacity of the inverter 21 is increased, it is possible to suppress a cost and a circuit scale required for the circuit used for the conducting the anti-islanding test.

(Third Embodiment)

FIG. 3 is a block diagram showing a test circuit 10B to which an AC load simulator 1B according to a third embodiment of the invention is applied.

The test circuit 10B has the AC load simulator 1B that substitutes for the AC load simulator 1, three AC load reactors 4 that substitute for the three AC load resistors 2, and an additionally provided AC power supply 25 in the test circuit 10 according to the first embodiment shown in FIG. 1. Other structures are the same as those in the test circuit 10 according to the first embodiment.

The AC load simulator 1B is connected between the inverter-side circuit breaker 23 and the system-side circuit breaker 24. The AC simulator 1B is a test apparatus that simulates resistance of a passive load in order to conduct an anti-islanding test of the inverter 21. The AC simulator 1B comprises a load simulation power converter 11B and a controller 12B.

The load simulation power converter 11B is configured of a back-to-back (BTB) converter. The load simulation power converter 11B comprises an inverter 111 and a converter 112. A direct-current side of the inverter 111 is connected to a direct-current side of the converter 112. An AC side of the inverter 111 is connected to each phase of a circuit between the inverter-side circuit breaker 23 and the system-side circuit breaker 24. An AC side of the converter 112 is connected to an AC power supply 25.

The load simulation power converter 11B converts AC power supplied from the inverter 21 and a power system simulation power supply 22 into AC power that is synchronized with the AC power supply 25. The load simulation power converter 11B supplies the converted AC power to the AC power supply 25.

The controller 12B controls the AC output from the load simulation power converter 11B to simulate resistance of an AC load. For example, if both load power of the AC load capacitors 3 and load power of the AC load reactors 4 are 500 kvar, the controller 12B controls the load simulation power converter 11B to simulate load power of 500 kW. At this time, the AC load capacitors 3 and the AC reactors 4 are caused to resonate.

A method of conducting the anti-islanding test is the same as that of the first embodiment.

According to this embodiment, when the AC load simulator 1B is controlled to simulate the resistance, the anti-islanding test can be conducted without providing resistors as the AC load for the test.

As a result, even if the inverter 21 as the test target has a large capacity, a large-capacity resistor does not have to be provided for the anti-islanding test. Therefore, when the capacity of the inverter 21 is increased, it is possible to suppress a cost and a circuit scale required for the circuit used for the conducting the anti-islanding test.

(Fourth Embodiment)

FIG. 4 is a block diagram showing a test circuit 100 to which an AC load simulator 10 according to a fourth embodiment of the invention is applied.

The test circuit 10C has the AC load simulator 1C that substitutes for the AC load simulator 1 and eliminates the three AC load resistors 2 and the three AC load capacitors 3 in the test circuit 10 according to the first embodiment shown in FIG. 1. Other structures are the same as those in the test circuit 10 according to the first embodiment.

The AC load simulator 1C is connected between the inverter-side circuit breaker 23 and the system-side circuit breaker 24. The AC load simulator 1C is a test apparatus that simulates a passive load in order to conduct an anti-islanding test of the inverter 21.

The AC load simulator 1C comprises an inductance simulation inverter 11i, a capacitance simulation inverter 11c, two capacitors 13, the resistance simulation power converter 11B according to the third embodiment, and a controller 12C. Here, the inductance simulation inverter 11i is the same as the load simulation inverter 11 according to the first embodiment. Further, the capacitance simulation inverter 11c is the same as the load simulation inverter 11 according to the second embodiment. Each capacitor 13 is connected to a direct-current side of each of the inductance simulation inverter 11i and the capacitance simulation inverter 11c like the first embodiment.

The controller 12C controls an AC output from the inductance simulation inverter 11i to simulate inductance of an AC load. The controller 12C controls an AC output from the capacitance simulation inverter 11c to simulate capacitance of the AC load. The controller 12C controls an AC output from the resistance simulation power converter 11B to simulate resistance of the AC load. As a result, the controller 12C controls the AC output to simulate impedance as a test condition.

For example, the controller 12C controls the AC outputs such that the resistance of load power becomes 500 kW, the inductance of the load power becomes 500 kvar, and the capacitance of the load power becomes 500 kvar. As a result, resonance occurs in the test circuit 10.

A method of conducting the anti-islanding test is the same as that in the first embodiment.

According to this embodiment, when output of the AC power is controlled to simulate the impedance as the test condition, the anti-islanding test can be conducted without providing the AC load for the test.

As a result, even if the inverter 21 as the test target has a large capacity, a large-capacity AC load does not have to be provided for the anti-islanding test. Therefore, when the capacity of the inverter 21 is increased, it is possible to suppress a cost and a circuit scale required for the circuit used for the conducting the anti-islanding test.

It is to be noted that the description has been given as to each of the AC load simulator 1, 1A, 1B, and 1C that simulate any one or all of the resistance, the inductance, and the capacitance in each of the foregoing embodiments, but an AC load formed of any other combination may be configured. That is, an AC load simulator that simulates an AC load which is a combination of arbitrary two selected from the resistance, the inductance, and the capacitance can be likewise configured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inverter test apparatus for use in testing an inverter interconnected with an alternating-current power system, the apparatus comprising:
a load simulation inverter configured to output alternating-current power; and
an alternating-current power controller configured to control the alternating-current power output from the load simulation inverter to simulate an alternating-current load of the inverter including performing control to simulate at least one of inductance, capacitance, or resistance, wherein the alternating-current power controller controls the alternating-current power output from the load simulation inverter independent of an output from the inverter.

2. The inverter test apparatus according to claim 1, wherein the alternating-current power controller is configured to perform control to simulate a reactor that resonates with a capacitor provided as an alternating-current load.

3. The inverter test apparatus according to claim 1, wherein the alternating-current power controller is configured to perform control to simulate a capacitor that resonates with a reactor provided as an alternating-current load.

4. The inverter test apparatus according to claim 1, wherein the alternating-current power controller is configured to perform control to simulate resistance as the alternating-current load.

5. An inverter test apparatus for use in testing an inverter interconnected with an alternating-current power system, the apparatus comprising:
a first alternating-current power output unit configured to output alternating-current power;
a first alternating-current power controller configured to control the alternating-current power output from the first alternating-current power output unit to simulate a reactor as an alternating-current load of the inverter;
a second alternating-current output unit configured to output alternating-current power;
a second alternating-current power controller configured to control the alternating-current power output from the second alternating-current power output unit to simulate a capacitor that resonates with the reactor simulated by the first alternating-current power controller;
a third alternating-current power output unit configured to output alternating-current power; and
a third alternating-current power controller configured to control the alternating-current power output from the third alternating-current power output unit to simulate resistance as the alternating-current load.

6. An inverter test circuit configured to test an inverter interconnected with an alternating-current power system, the circuit comprising:

a first circuit breaker configured to disconnect the inverter from the inverter test circuit;
a second circuit breaker configured to disconnect the alternating-current power system from the inverter test circuit;
a load simulation inverter configured to output alternating-current power; and
an alternating-current power controller configured to control the alternating-current power output from the load simulation inverter to simulate an alternating-current load of the inverter including performing control to simulate at least one of inductance, capacitance, or resistance, wherein the alternating-current power controller controls the alternating-current power output from the load simulation inverter independent of an output from the inverter.

7. The inverter test circuit according to claim 6, further comprising a capacitor provided as an alternating-current load, wherein the alternating-current power controller is configured to perform control to simulate a reactor that resonates with the capacitor.

8. The inverter test circuit according to claim 6, further comprising a reactor provided as an alternating-current load, wherein the alternating-current power controller is configured to perform control to simulate a capacitor that resonates with the reactor.

9. The inverter test circuit according to claim 6, further comprising:
a reactor provided as an alternating-current load; and
a capacitor provided as an alternating-current load, wherein the alternating-current power controller is configured to perform control to simulate resistance.

10. An inverter test circuit configured to test an inverter interconnected with an alternating-current power system, the circuit comprising:
a first circuit breaker configured to disconnect the inverter from the inverter test circuit;
a second circuit breaker configured to disconnect the alternating-current power system from the inverter test circuit;
a first alternating-current power output unit configured to output alternating-current power;
a first alternating-current power controller configured to control the alternating-current power output from the first alternating-current power output unit to simulate a reactor as an alternating-current load of the inverter;
a second alternating-current power output unit configured to output alternating-current power;
a second alternating-current power controller configured to control the alternating-current power output from the second alternating-current power output unit to simulate a capacitor that resonates with the reactor simulated by the first alternating-current power controller;
a third alternating-current power output unit configured to output alternating-current power; and
a third alternating-current power controller configured to control the alternating-current power output from the third alternating-current power output unit to simulate resistance as the alternating-current load.

* * * * *